United States Patent
Chang et al.

(10) Patent No.: US 9,740,602 B2
(45) Date of Patent: Aug. 22, 2017

(54) MEMORY ORPRATING METHOD AND MEMORY DEVICE USING THE SAME

(71) Applicant: MACRONIX INTERNATIONAL CO., LTD., Hsinchu (TW)

(72) Inventors: Yu-Ming Chang, Pingtung County (TW); Yung-Chun Li, New Taipei (TW); Hsiang-Pang Li, Zhubei (TW); Yuan-Hao Chang, Taipai (TW); Tei-Wei Kuo, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 42 days.

(21) Appl. No.: 14/805,498

(22) Filed: Jul. 22, 2015

(65) Prior Publication Data

US 2016/0147464 A1    May 26, 2016

Related U.S. Application Data

(60) Provisional application No. 62/084,522, filed on Nov. 25, 2014.

(51) Int. Cl.
*G06F 12/00*  (2006.01)
*G11C 11/56*  (2006.01)
(Continued)

(52) U.S. Cl.
CPC .......... *G06F 12/00* (2013.01); *G11C 11/5628* (2013.01); *G11C 16/10* (2013.01);
(Continued)

(58) Field of Classification Search
CPC .... G06F 3/0613; G06F 3/0679; G06F 3/0644; G06F 3/0619; G06F 12/00;
(Continued)

(56) References Cited

U.S. PATENT DOCUMENTS

2009/0307413 A1* 12/2009 Chu .................... G06F 12/0246
                                                          711/103
2010/0332922 A1    12/2010 Chang et al.
(Continued)

OTHER PUBLICATIONS

Chang, et al.: "An SLC-like Programming Scheme for MLC Flash Memory"; Macronix International Co., Ltd..,; Department of Computer Science and Information Engineering National Taiwan University; Jun. 7, 2015; pp. 1-13.
(Continued)

*Primary Examiner* — Hiep Nguyen
(74) *Attorney, Agent, or Firm* — McClure, Qualey & Rodack, LLP

(57) ABSTRACT

An operating method for a memory, the memory comprising at least one memory block including a plurality of first pages and a plurality of second pages corresponding to the first pages, the operating method including the following steps: determining whether a target first page of the first pages is valid, wherein the target first page is corresponding to a target second page of the second pages; if the target first page is valid, performing first type programming on the target second page; if the target first page is invalid, performing second type programming on the target second page.

18 Claims, 8 Drawing Sheets

(51) Int. Cl.
*G11C 16/10* (2006.01)
*G11C 16/04* (2006.01)

(52) U.S. Cl.
CPC .. *G11C 16/0483* (2013.01); *G11C 2211/5641* (2013.01); *G11C 2211/5648* (2013.01)

(58) Field of Classification Search
CPC . G11C 11/5628; G11C 16/10; G11C 16/0483; G11C 2211/5641; G11C 2211/5648
See application file for complete search history.

(56) References Cited

U.S. PATENT DOCUMENTS

| | | | | |
|---|---|---|---|---|
| 2011/0161565 | A1* | 6/2011 | Chua | G06F 12/0246 711/103 |
| 2012/0166706 | A1* | 6/2012 | Pua | G06F 12/0246 711/102 |
| 2012/0246397 | A1* | 9/2012 | Nakai | G06F 12/0638 711/103 |
| 2013/0039129 | A1* | 2/2013 | Radke | G11C 16/0483 365/185.09 |
| 2013/0124787 | A1* | 5/2013 | Schuette | G06F 12/0246 711/103 |
| 2013/0246687 | A1* | 9/2013 | Chang | G06F 12/0246 711/103 |
| 2014/0133220 | A1* | 5/2014 | Danilak | G11C 11/16 365/158 |
| 2015/0039948 | A1* | 2/2015 | Um | G06F 11/0706 714/710 |
| 2015/0324282 | A1* | 11/2015 | Seekins | G06F 12/02 714/6.11 |

OTHER PUBLICATIONS

TIPO Office Action dated Oct. 12, 2016 in Taiwan application (No. 104123607).

* cited by examiner

MEMORY ORPRATING METHOD AND MEMORY DEVICE USING THE SAME

This application claims the benefit of U.S. provisional application Ser. No. 62/084,522, filed Nov. 25, 2014, the disclosure of which is incorporated by reference herein in its entirety.

TECHNICAL FIELD

The disclosure relates in general to an operating method for a memory and an associated memory device.

BACKGROUND

In the recent years, flash memories are commonly used in smart phones, tablets and Embedded Multimedia Card (eMMC) applications. With heavy pressure on pursuing more cost-effective solutions for flash storage systems, adopting Multi-Level-Cell (MLC) technology is a key step to double the memory capacity at low fabrication cost. However, compared to Single-Level-Cell (SLC) programming technology, MLC usually take more time to program data.

Therefore, there is a need to provide an operating method for a memory and an associated memory device to improve the program efficiency for flash memory.

SUMMARY

The disclosure is directed to an operating method for a memory and an associated memory device.

According to one embodiment, an operating method for a memory is provided. The memory includes at least one memory block including a plurality of first pages and a plurality of second pages corresponding to the first pages. The operating method includes the following steps: a target first page of the first pages is determined whether is valid, wherein the target first page is corresponding to a target second page of the second pages; if the target first page is valid, first type programming is performed on the target second page; and if the target first page is invalid, second type programming is performed on the target second page.

According to another embodiment, an operating method for a memory is provided. The memory includes a memory block including a first sub-block including a plurality of high pages and a second sub-block including a plurality of low pages corresponding to the high pages. The operating method includes the following steps: a target first page of the first pages is determined whether is valid according to validation information of the first pages, wherein the target first page is corresponding to a target second page of the second pages. If the target first page is invalid, SLC-like programming is performed on the target second page.

According to an alternative embodiment, a memory device is provided. The memory device includes a memory, a first type memory function module, a second type memory function module, a validation information recording unit, and a controller. The memory includes a plurality of memory blocks, each of which comprises a plurality of first pages and a plurality of second pages corresponding to the first pages. The first type memory function module is to perform a first type programming on the memory blocks. The second type memory function module is to perform a second type programming on the memory blocks. The validation information recording unit is to record validation information of the first pages. The controller is to control the first type memory function module and the second type memory function module according to the validation information recorded by the validation information recording unit, and to selectively perform first type programming or second type programming on the second pages.

Figure 1:
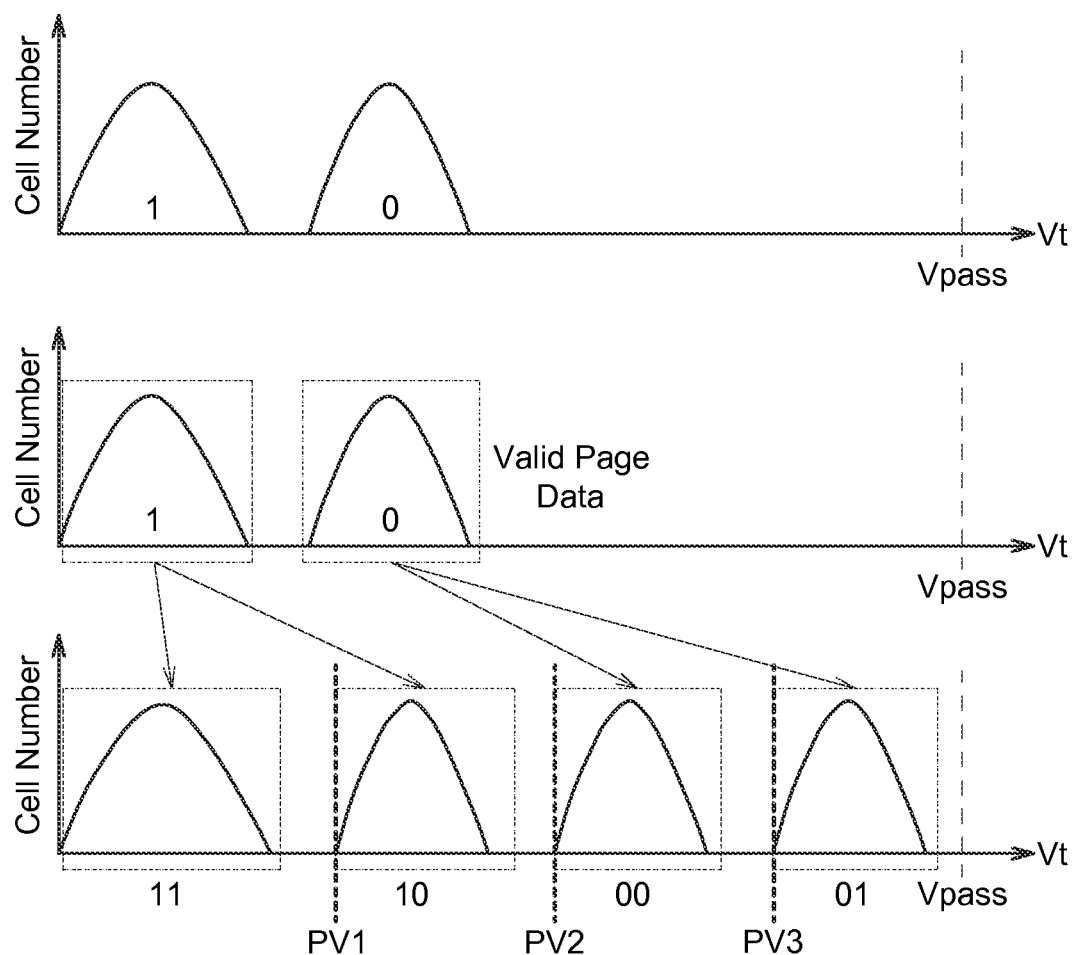
FIG. 1 is a schematic diagram illustrating an exemplary first type programming for MLC according to one embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

The present invention provides an operating method for a memory and an associated memory device, which involves two different types of programming: first type programming and second type programming. When a page of a memory block is valid, the paired page corresponding to the page is programmed with the first type programming; when the page is invalid, the corresponding paired page is programmed with the second type programming. Since the second type programming may increase the program speed and the data reliability of the memory, the overall program efficiency can be improved.

FIG. 1 is a schematic diagram illustrating an exemplary first type programming for Multi-Level-Cell (MLC) according to one embodiment of the present invention. The first type programming may be a typical program operation for MLC. This programming can be separated into two stages to program data into different two pages of a word line. In the example, the first written page is called a "high page" and the second page written to the same word line is referred to as a "low page." In the first stage, the high page data will be first programmed to the word line. In the second stage, the low page data will be programmed to the same word line. Thus, in the example of FIG. 1, the memory cells that should store data "1" of the high page will remain in the same state (threshold voltage (Vt) state), while the memory cells that should hold data "0" of the high page will be programmed forward to the logical state "0" with higher threshold voltage. Note that, the final cell distribution of the first stage is similar to the distribution after programming a Single-Level-Cell (SLC) page; therefore, the speed of programming a high page is very close to that of programming a SLC page.

In the second stage, to program the low page into the same word line, the MLC will require four logical states to represent 2 bit data. For example, the memory cells currently at logical state "1" that should store another bit data "0" of the low page will be programmed toward the logical state "10," while the memory cells currently at logical state "0" that should store another bit data "0" of the low page will be programmed toward the logical state "01", and so forth.

In FIG. 1, the voltage Vpass is a pass-gate voltage applied on unselected word lines. For example, when a page in a memory block is programmed or read, the corresponding word line will be applied with a program voltage or a read (sensing) voltage. At the same time, the other word lines in the same memory block are applied with the voltage Vpass to let the current flow through the channel in the same memory string (e.g., NAND string). Since an over-programmed memory cell that holds a higher threshold voltage than the voltage Vpass will cut-off the channel current in the corresponding memory string and disable the program and read operations for the memory cells, the voltage Vpass may determine the maximal value of each memory cell's threshold voltage.

Suppose that a high page is still valid when another page data is ready to be programmed into the same physical location of the corresponding high page. As mentioned above, four logical states, namely "11", "10", "00", and "01", are needed to represent 2-bit information for each cell. Therefore, the original two cell distributions of logical "1" and "0" would be further programmed into four distributions. In this example, the program verify voltage PV1 is used to determine the low bound of cell distribution of logical state "10". More specifically, the memory cells that will be programmed to logical state "10" originally in the cells of logical state "1" may pass through the program verify voltage PV1 by, for example, Incremental Step Pulse Programming (ISPP). Similarly, the program verify voltages PV2 and PV3 respectively determine the low bound of cell distributions of logical states "00" and "01".

It is noted that since the remaining window of threshold voltage is only from the high bound of logical state "0" to the voltage Vpass, to accommodate programming all cells into four distributions should adopt the ISPP with a small-increased voltage step to lower the overlap between adjacent cell distributions of different logical state. Generally, ISPP with the small step will require a large number of program shots, which in turn degrades the program efficiency. Thus, the second stage of the abovementioned first type programming usually takes more time than the first stage.

Figure 2:
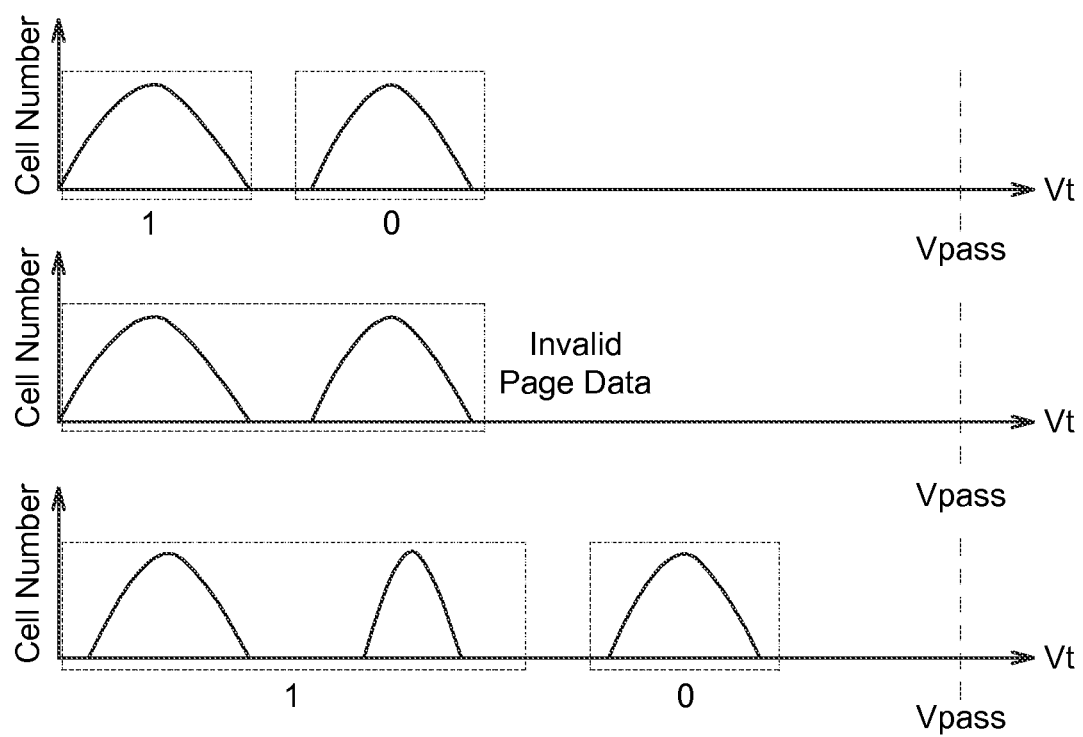
FIG. 2 is a schematic diagram illustrating the second type programming according to one embodiment of the present invention.

FIG. 2 is a schematic diagram illustrating the second type programming according to one embodiment of the present invention. At the start, high page programming for logical state "1" and "0" is the same as in FIG. 1. Next, when the system information is transferred to the internal MLC flash memories, the data in the high page might become invalid (e.g., the original data has been overwritten). That is to say, the high page could be discarded or trimmed virtually, which means that there is no difference among the cells that are either in logical state "1" or logical state "0". Then, in the second stage, the second page data is programmed to the memory cells currently containing invalid high page data. At this time, the cells originally in logical state "1" and "0" are treated equally as in the same logical state. Therefore, the memory cells that should store data "1" of the coming low page could hold the original threshold voltage state, and the memory cells that should store data "0" of the low page will be programmed to the remaining window of threshold voltage from the high bound of cell distribution of new logical state "1" to the voltage Vpass. As shown in FIG. 2, the cells (originally in logical state "1" or "0") that will store data "0" of the low page are programmed until the corresponding threshold voltage exceeds the program and verify voltage PV4. With the abovementioned mechanism, the second type programming is similar to a SLC program operation, which achieves higher program speed than that of the MLC program operation. Thus, in one aspect, the second type programming can be deemed as SLC-like programming. Note that, the present invention is not limited to programming the high pages of the memory block in the first stage and programming the corresponding low pages in second stage. In a more general form, the proposed program operation may program data into a page of a memory block in the first stage and program other data into the corresponding paired page in the second stage. The page may be included in a first sub-block of the memory block (e.g., top half block), and the paired page corresponding to the page may be included in a second sub-block of the memory block (e.g., bottom half block). The page data and the paired page data may be programmed to the same word line.

The proposed memory operating method and the associated memory device may utilize the second type programming to program low pages to a word line when the high page data of the same word line is invalid, and hence the overall program efficiency and speed are improved. Below, two program designs are provided to further explain the use of the second type programming.

I. Static SLC-Like Design

In the static SLC-like design, high pages in the memory block high programmed in a first predetermined order, and after completing the programming of the first pages, the low pages corresponding to these high pages are then programmed in a second predetermined order. The first predetermined order and the second predetermined are the same or not the same.

Figure 3:
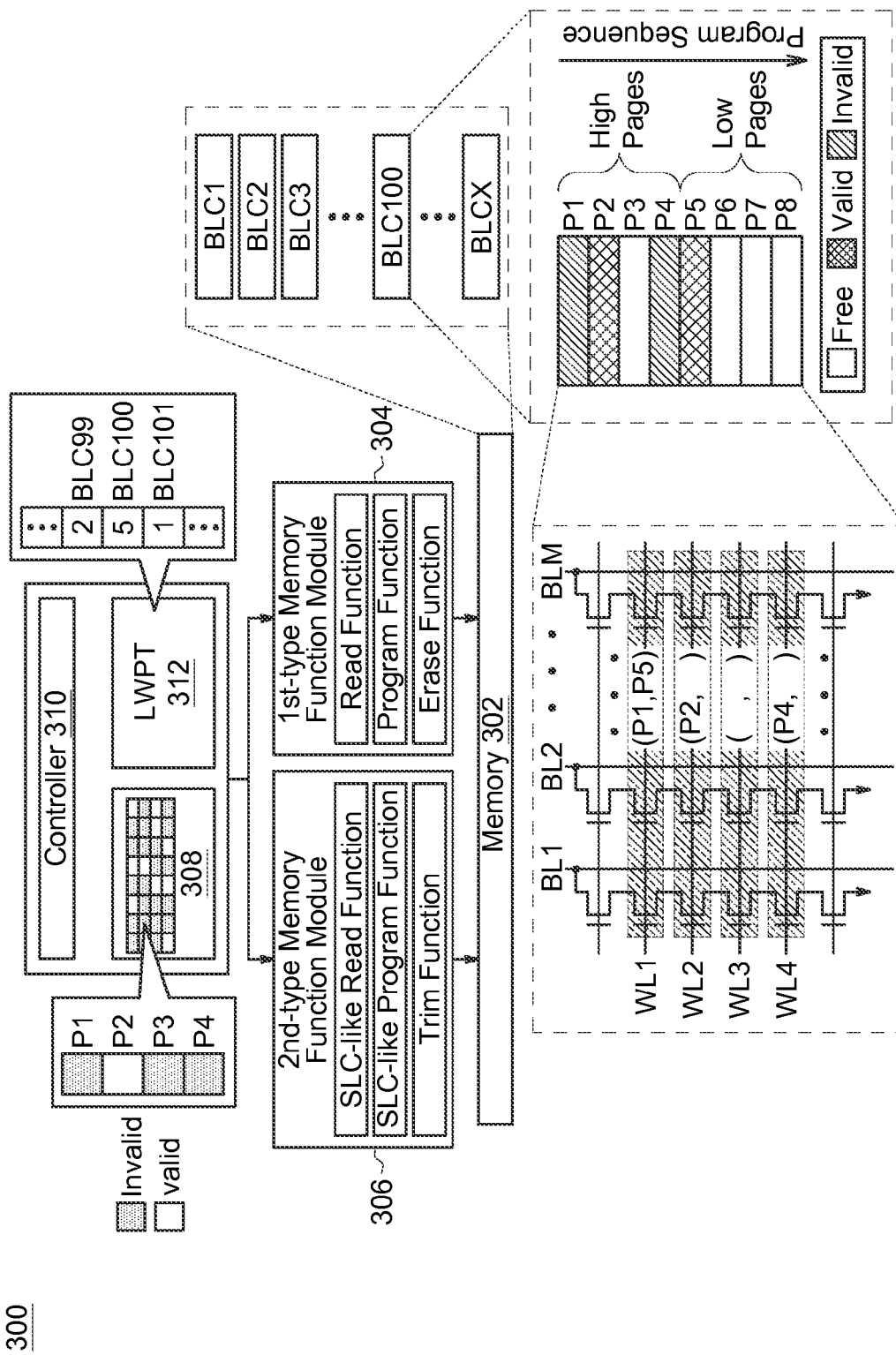
FIG. 3 shows a memory device performing the static SLC-like design according to one embodiment of the present invention.

FIG. 3 shows a memory device 300 performing the static SLC-like design according to one embodiment of the present invention. The memory device 300 comprises a memory 302, a first type memory function module 304, a second type memory function module 306, a validation information recording unit 308 and a controller 310.

The memory 302 may be NAND flash memory or any other type of storage device. The memory 302 may include a plurality of memory blocks BLC1-BLCX, each of which includes N word lines (in FIG. 3, N=4). Each word line includes M memory cells (connecting to M bit lines). Suppose that one page has M memory cells, the page is a basic unit for read/write operations. Storing the data of two pages in a word line is equivalent to storing two bit data in each cell of the same word line. As mentioned above, the first written page is called a high page and the second page written to the same word line is referred to as a low page.

The first type memory function module 304 is configured to perform a typical/default memory read function, a program function and an erase function on the memory blocks BLC1-BLCX. For example, the first type memory function module 304 may perform the first type programming shown in FIG. 1 on a target high/low page in the memory block.

The second type memory function module 306 is configured to perform second type memory functions, such as SLC-like read function, SLC-like program function and trim function, on the memory blocks BLC1-BLCX. For example, the second type memory function module 306 may use the second type programming shown in FIG. 2 to program low pages when the corresponding high pages in the same memory cell are invalid. The trim function is used to let the upper virtual layer such as flash translation layer or flash file system provide mapping knowledge of page data to the second type memory function module 306, and correspondingly the validness information of each page can be maintained on the validation information recording unit 308.

The validation information recording unit 308 is configured to record the validation information of high pages. The validation information recording unit 308 may be realized by look-up table, list or any kind of storing media. The validation information may indicate which first page is invalid. In one embodiment, if a high page has not been programmed with data, the controller 310 may set this high page as invalid when programming the corresponding low page. Generally, the validation information recording unit 308 only needs to maintain the validation information of the high pages, but the present invention is not limited thereto.

The controller 310 may control the first type memory function module 304 and the second type memory function module 306 according to the validation information recorded by the validation information recording unit 308, to selectively perform the first type programming or the second type programming. In one embodiment, the controller 310 may determine whether a high page is valid according to the validation information. If the high page is valid, the controller 310 may perform first type programming (e.g., typical MLC programming) on the corresponding low page. If the high page is invalid, the controller 310 may perform second type programming on the corresponding low page (e.g., SLC-like programming).

For example, when a low page corresponds to an invalid high page, the controller 310 may control the second type memory function module 306 to program the low page with the SLC-like program function. For a low page programmed by the SLC-like program function, the controller 310 may control the second type memory function module 306 to read it with the corresponding SLC-like read function.

In one embodiment, the memory device 300 further includes a Last Written Page Table (LWPT) 312, to record the last written page numbers of all memory blocks BLC1-BLCX.

Understandably, the abovementioned elements of the memory device 300, such as the first type memory function module 304—second type memory function module 306—validation information recording unit 308, controller 310 and the LWPT 312, can be realized by software, firmware or hardware (e.g., processor, micro-processor or logic circuit). In one embodiment, the first type memory function module 304—second type memory function module 306—validation information recording unit 308, controller 310 and the LWPT 312 may be implemented in Memory Technology Device Layer (MTD layer), but the present invention is not limited thereto, these elements may also be implemented in the memory 302, or in any other virtual layer of the memory device 300.

In the static SLC-like design, each page may be statically programmed to a fixed location. As shown in FIG. 3, a memory block BLC100 consists of 4 word lines, each of which includes one-page cells, where these cells could be used to program two page data. In this example, the high pages P1, P2, P3 and P4 are allocated to word lines WL1, WL2, WL3, and WL4 respectively, and the corresponding low pages P5, P6, P7 and P8 are allocated to word lines WL1, WL2, WL3 and WL4 respectively. In the logical view of memory block BLC100, pages P1, P2, P4 and P5 have been programmed with user data; correspondingly, in the physical view of memory block BLC100, the 4 page data are respectively programmed to high page locations of word lines WL1, WL2 and WL4 and low page location of word line WL1. The validation information of the high pages P1-P4 are recorded in the validation information recording unit 308. In this example, the high pages P1 and P4 that contain invalid data (e.g., outdated data) will be marked as invalid pages, and the high page P3 that has not been programmed with user data will be deemed as an invalid page as well after programming other pages (e.g., page P4, with higher page number). This is because the pages of a memory block are programmed sequentially in page number order in most of the specification of MLC flash memories. Moreover, since the last written page of the memory block BLC100 is page P5 now, the number of page P5 (e.g., "5") will be correspondingly maintained on the LWPT 312.

In order to program low pages with the SLC-like program function to increase the overall program speed, pages (e.g., P1-P4) in the top half block of the memory block (e.g., BLC100) will be respectively programmed to different word lines WL1-WL4 first. Then, according to the validation information of the pages P1-P4, the SLC-like program operation can be adaptively used to program the pages (e.g., pages P5-P8 shown in FIG. 3) in the bottom half block of the memory block.

Figure 4A:
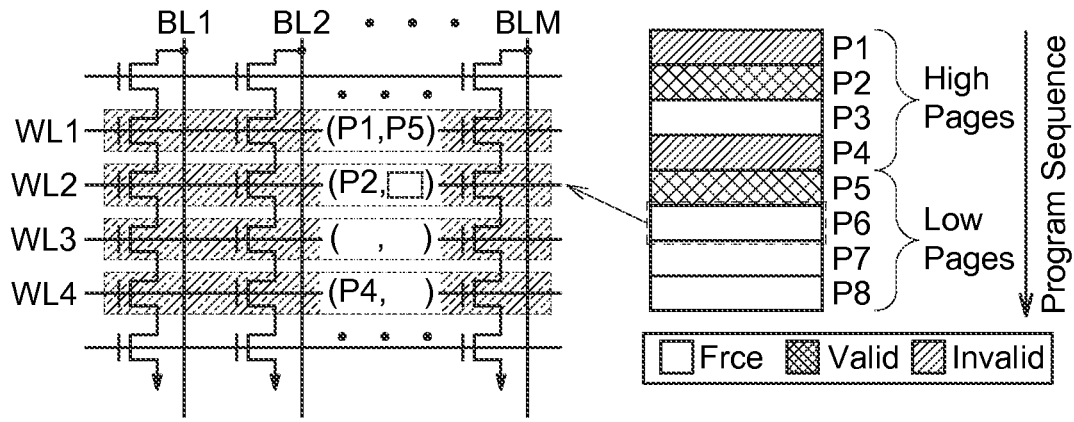
FIGS. 4(*a*)-4(*c*) illustrate an example of programming a memory block with static SLC-like design.
Figure 4B:
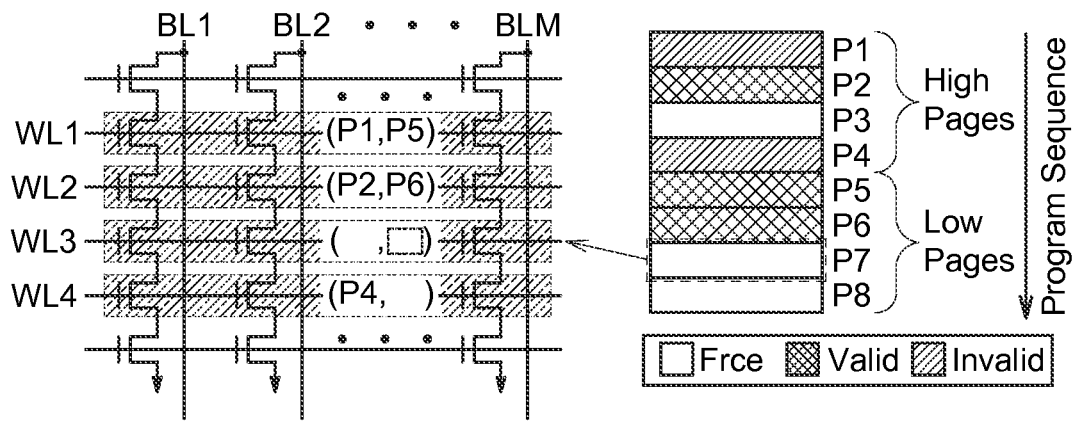
Figure 4C:
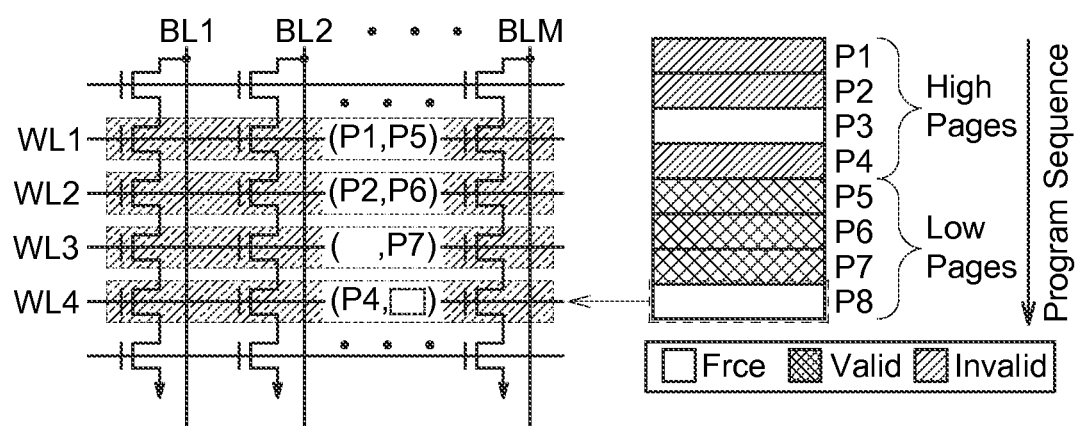

FIGS. 4(*a*)-4(*c*) illustrate an example of programming a memory block with static SLC-like design. As shown in FIG. 4(*a*), the high pages P1, P2 and P4 are first and sequentially programed to word lines WL1, WL2 and WL4. Since high page P1 was invalidated by trim function, the corresponding low page P5 is programmed to same word line WL1 with the proposed SLC-like program function. After that, any read request to the low page P5 is served with the SLC-like read function of the second type memory function module 306 to provide corresponding read voltage.

Then, as shown in FIG. 4(*b*), if a write request is issued to the low page P6 of the memory block BLC100, the first type programming (e.g., typical program function) is invoked by the first type memory function module 304 to serve the request since the corresponding high page P2 of the low page P6 currently contains valid data. Next, as shown in FIG. 4(*c*), if another write requests are issued to the low pages P7 and P8, the SLC-like program function is invoked by the second type memory function module 306 to program data of page P7 to word line WL3 and to program data of page P8 to word line WL4. This is because the related high pages (P3 and P4) of word lines WL3 and WL4 are deemed as invalid pages.

II. Dynamic SLC-Like Design

Because valid high pages possibly become invalid when their related low pages are needed to be programmed, in dynamic SLC-like design, the controller 310 will firstly program low pages to the word line with invalid high pages so as to further increase the possibility in programming low pages with second type programming (e.g., SLC-like program operation). For example, if high pages of a memory block include an invalid high page and a valid high page, the controller 310 may program the low page corresponding to the invalid high page with the second type programming (e.g., SLC-like program operation) prior to programming another low page corresponding to the valid high page.

Figure 5:
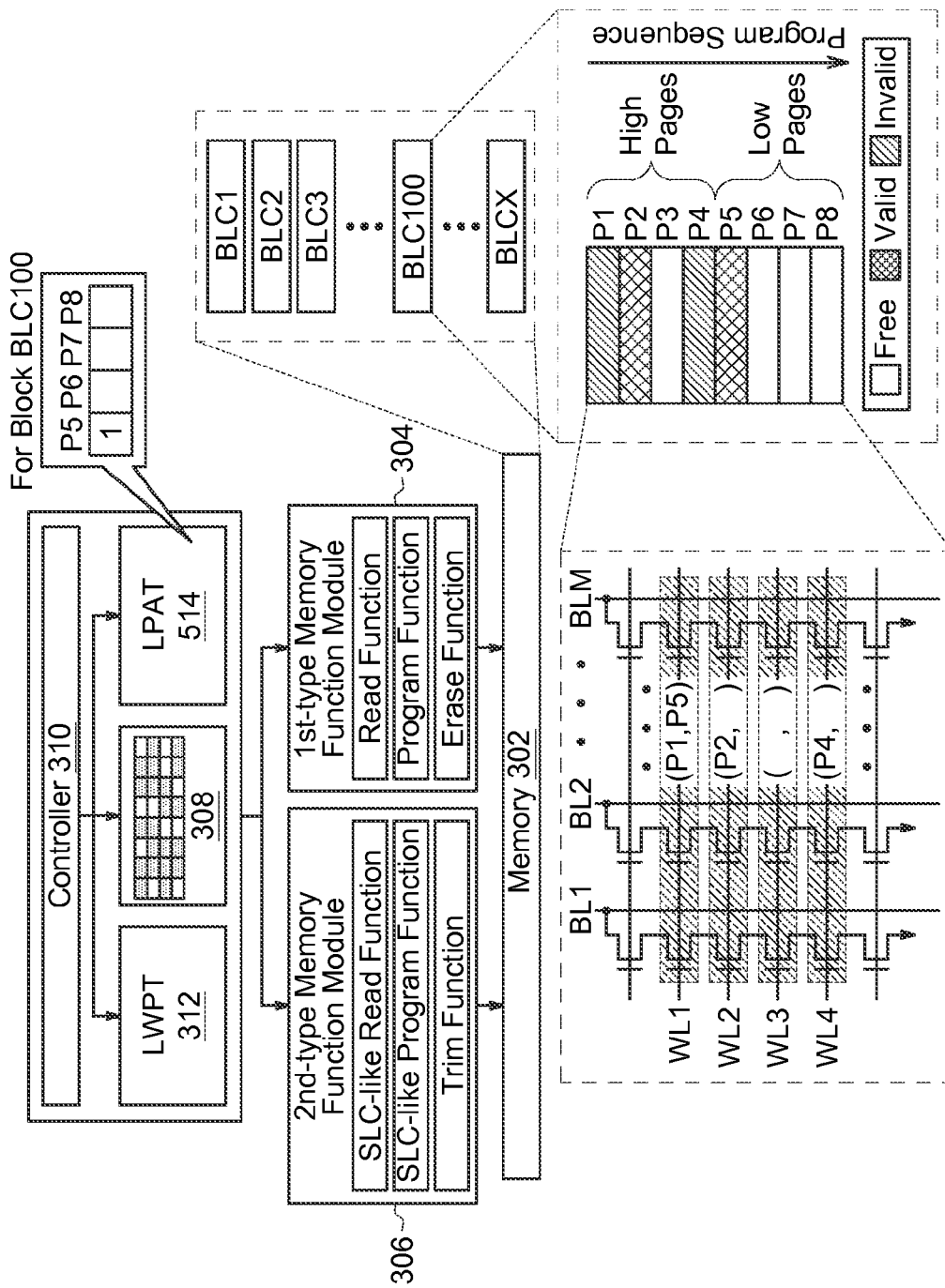
FIG. 5 illustrates a memory device performing the dynamic SLC-like design according to one embodiment of the present invention.

FIG. 5 illustrates a memory device 500 performing the dynamic SLC-like design according to one embodiment of the present invention. The main difference between the memory device 500 and the memory device 300 is that the former further includes a Low Page Allocation Table (LPAT) 514 to record corresponding word line number of each low page for the memory blocks, which supports dynamically programming low page to any word line. For example, the data of low page P5 in logical view of memory block BLC100 is programmed to low page location of word line WL1 in physical view of memory block BLC100 so that the corresponding word line location, i.e., word line WL1 in memory block BLC100, will be stored in the column of page P5 of LPAT 514.

Figure 6A:
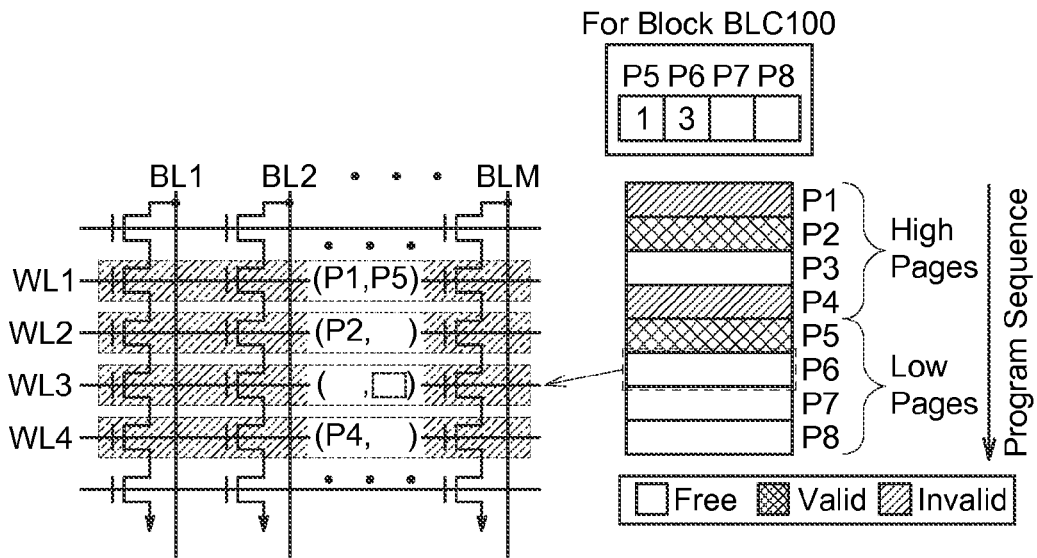
FIGS. 6(*a*)-6(*c*) illustrate an example of programming a memory block with dynamic SLC-like design.
Figure 6B:
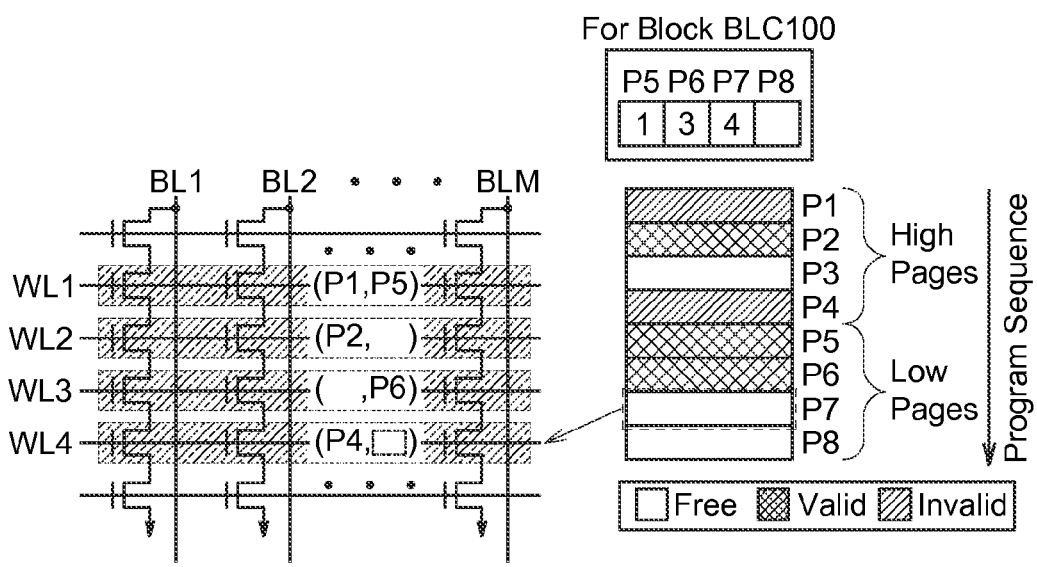
Figure 6C:
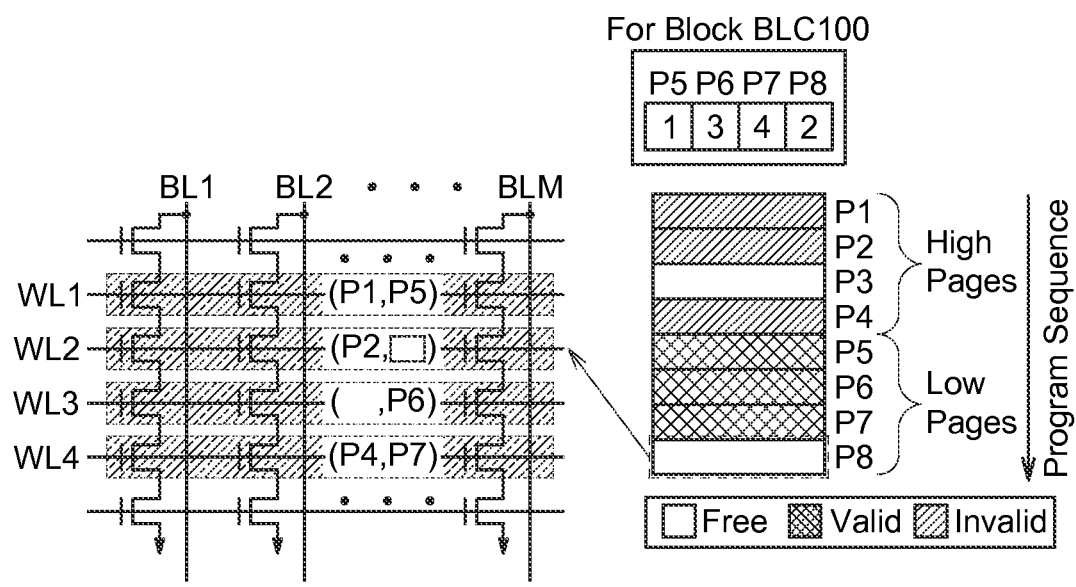

FIGS. 6(a)-6(c) illustrate an example of programming a memory block with dynamic SLC-like design. As shown in FIG. 6(a), if a write request is issued to low page P6, data of low page P6 will be programmed to word line WL3 instead of word line WL2. This is because the high page of word line WL3 has not been programmed with data (i.e., free page) and will be deemed as an invalid page, and the high page P2 of word line WL2 currently contains valid data. Meanwhile, the column of low page P6 in LPAT 514 may store the corresponding word line number (i.e., "3") of the programmed word line.

Then, as shown in FIG. 6(b), if the next write request is issued to low page P7, the controller 310 will keep to searching for a word line that contains invalid high page. In this example, since the high page P4 of word line WL4 is invalid and the high page P2 of word line WL2 is still valid, the controller 310 may choose word line WL4 to program with data of low page P7.

Finally, if a write request is issued to the low page P8 of memory block BLC100 and the high page P2 of word line WL2 has become invalid, the controller 310 may control the second type memory function module 306 to program the low page P8 with SLC-like function. In contrast, if high page P2 of word line WL2 is still valid, the controller 310 may control the first type memory function module 304 to program the low page P8 with typical/default program function.

In one embodiment, in order to further increase the possibility of enabling SLC-like functions, the controller 310 may arrange data to be written into the high pages to maximize the possibility of occurring of invalid high pages. For example, the controller 310 may write hot data (i.e., data with high update frequency) into the high pages prior to writing other data (e.g., cold data with low update frequency) into the high pages, such that the programmed high page are easy to become invalid pages, which in turn increases the possibility of enabling SLC-like functions.

In summary, the proposed memory operating method and the associated memory device may utilize the second type programming to program low pages to a word line when the high page data of the same word line is invalid, and hence the overall program efficiency and speed are improved. Moreover, to further increase the possibility of enabling the second type programming, the proposed invention may preferentially program low page data to a word line that currently contains invalid high page data or has not been programmed user data, or preferentially program hot data into the high pages.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An operating method for a memory, the memory comprising at least one memory block including a plurality of first pages and a plurality of second pages corresponding to the first pages defined on a plurality of word lines, the operating method comprising:
   determining whether a target first page of the first pages is valid according to validation information of the first pages, wherein the target first page is corresponding to a target second page of the second pages;
   if the target first page is valid, performing a first type programming on the target second page; and
   if the target first page is invalid, performing a second type programming on the target second page.

2. The operating method according to claim 1, further comprising:
   after programming the first pages to different at least some of the word lines of the at least one memory block, programming the second pages.

3. The operating method according to claim 1, further comprising:
   programming the first pages in a first predetermined order; and
   after completing programming of the first pages, programming the second pages in a second predetermined order.

4. The operating method according to claim 1, further comprising:
   when the first pages comprise an invalid first page and a valid page, programming one of the second pages corresponding to the invalid first page prior to programming another one of the second pages corresponding to the valid first page.

5. The operating method according to claim 1, further comprising:
   recording, by a low page allocation table, word line numbers corresponding to the second pages.

6. The operating method according to claim 1, further comprising:
   writing a first data into the first pages before writing a second data into the first pages;
   wherein update frequency of the first data is higher than that of the second data.

7. The operating method according to claim 1, further comprising:
   writing a first data into the first pages, and then writing a second data into remaining space of the first pages;
   wherein update frequency of the first data is higher than that of the second data.

8. The operating method according to claim 1, further comprising:
   setting the target first page as invalid when the target first page has not been programmed with data.

9. An operating method for a memory comprising a memory block, wherein the memory block comprises a first sub-block including a plurality of first pages and a second sub-block including a plurality of second pages corresponding to the first pages, and the operating method comprises:
   determining whether a target first page of the first pages is valid according to validation information of the first pages, wherein the target first page is corresponding to a target second page of the second pages; and
   if the target first page is invalid, performing SLC-like programming on the target second page.

10. The operating method according to claim 9, further comprising:
  programming the first sub-block prior to programming the second sub-block.

11. The operating method according to claim 9, further comprising:
  programming the first pages in a first predetermined order; and
  then programming the second pages in a second predetermined order.

12. The operating method according to claim 9, further comprising:
  when the first pages comprise an invalid first page and a valid page, programming one of the second pages corresponding to the invalid first page prior to programming another one of the second pages corresponding to the valid first page.

13. The operating method according to claim 9, further comprising:
  writing a first data into the first pages before writing a second data into the first pages;
  wherein update frequency of the first data is higher than that of the second data.

14. The operating method according to claim 9, further comprising:
  setting the target first page as invalid when the target first page has not been programmed with data.

15. A memory device, comprising:
  a memory comprising a plurality of memory blocks, each of which comprising a plurality of first pages and a plurality of second pages corresponding to the first pages;
  a first type memory function module, performing a first type programming on the memory blocks;
  a second type memory function module, performing a second type programming on the memory blocks;
  a validation information recording unit, recording validation information of the first pages; and
  a controller, controlling the first type memory function module and the second type memory function module according to the validation information recorded by the validation information recording unit, to selectively perform the first type programming or the second type programming on the second pages, wherein the controller determines whether a target first page of the first pages is valid according to the validation information, wherein the target first page is corresponding to a target second page of the second pages;
  if the target first page is valid, the controller performs the first type programming on the target second page; and
  if the target first page is invalid, the controller performs the second type programming on the target second page.

16. The memory device according to claim 15, wherein the first pages are programmed in a first predetermined order, after programming of the first pages is completed, the second pages are programmed in a second predetermined order.

17. The memory device according to claim 15, wherein when the first pages comprise an invalid first page and a valid page, the controller programs one of the second pages corresponding to the invalid first page prior to programming another one of the second pages corresponding to the valid first page.

18. The memory device according to claim 15, wherein the controller writes a first data into the first pages before writing a second data into the first pages, wherein update frequency of the first data is higher than that of the second data.

* * * * *